(12) United States Patent
Yumi

(10) Patent No.: US 9,510,452 B2
(45) Date of Patent: Nov. 29, 2016

(54) ELECTROMAGNETIC SHIELDING MEMBER AND ELECTROMAGNETIC SHIELDING STRUCTURE

(71) Applicant: Kitagawa Industries Co., Ltd., Aichi (JP)

(72) Inventor: Hideo Yumi, Aichi (JP)

(73) Assignee: KITAGAWA INDUSTRIES CO., LTD., Aichi (JP)

( * ) Notice: Subject to any disclaimer, the term of this patent is extended or adjusted under 35 U.S.C. 154(b) by 0 days.

(21) Appl. No.: 14/668,173

(22) Filed: Mar. 25, 2015

(65) Prior Publication Data

US 2015/0282394 A1   Oct. 1, 2015

(30) Foreign Application Priority Data

Mar. 25, 2014   (JP) ................. 2014-061806

(51) Int. Cl.
*H05K 9/00*   (2006.01)
*H05K 1/18*   (2006.01)
*H05K 1/02*   (2006.01)

(52) U.S. Cl.
CPC .......... *H05K 1/181* (2013.01); *H05K 1/0243* (2013.01); *H05K 9/0026* (2013.01); *H05K 9/0088* (2013.01); *H05K 1/0209* (2013.01); *H05K 1/0216* (2013.01); *H05K 2201/0723* (2013.01); *H05K 2201/10371* (2013.01)

(58) Field of Classification Search
CPC ... H05K 9/0026; H05K 9/003; H05K 9/0088
See application file for complete search history.

(56) References Cited

U.S. PATENT DOCUMENTS

2002/0129951 A1*  9/2002  Babb ............... H01L 23/552
                                                   174/358
2003/0193794 A1* 10/2003  Reis ................ H01L 23/552
                                                   361/816

FOREIGN PATENT DOCUMENTS

JP        2002-026204 A     1/2002

* cited by examiner

*Primary Examiner* — Hung V Ngo
(74) *Attorney, Agent, or Firm* — Koppel, Patrick, Heybl & Philpott

(57) ABSTRACT

An electromagnetic shielding member comprises: a shielding portion, including a metal material, for sealing an electronic component on an electronic circuit board, between the shielding portion itself and the electronic circuit board; a dielectric portion between a conductive portion of the electronic component, and the shielding portion, the dielectric portion including a dielectric material having a relative permittivity of 6 or more; and a laminated portion around the electronic component, the laminated portion being a laminate of the shielding portion and the dielectric portion.

13 Claims, 4 Drawing Sheets

ELECTROMAGNETIC SHIELDING MEMBER AND ELECTROMAGNETIC SHIELDING STRUCTURE

CROSS-REFERENCE TO RELATED APPLICATION

This application claims priority from Japanese Patent Application No. 2014-061806 filed with the Japan Patent Office on Mar. 25, 2014, the entire content of which is hereby incorporated by reference.

BACKGROUND

1. Technical Field

The present disclosure relates to an electromagnetic shielding member and an electromagnetic shielding structure.

Description of the Related Art

An electromagnetic shielding member is known which is attached to an electronic component mounted on an electronic circuit board. In such an electromagnetic shielding member, the electronic component is sealed in between, for example, a metal member attached onto the electronic circuit board and the electronic circuit board (for example, refer to JP-A-2002-026204).

In a case of the technology described in JP-A-2002-026204, a thermally conductive material having conductivity is interposed between an electronic component and a metal member. Moreover, connection portions at both ends of the metal member are connected to an earth electrode (illustration omitted) of a printed wiring board.

In such a structure, the thermally conductive material and the metal member are held stably at earth potential. Hence, an electromagnetic wave coming out of and going into an electronic component can be shielded extremely well. Moreover, the heat generated in the electronic component is transferred to the metal member via the thermally conductive material. Consequently, it is also possible to encourage heat dissipation from the electronic component.

SUMMARY

An electromagnetic shielding member comprises: a shielding portion, including a metal material, for sealing an electronic component on an electronic circuit board, between the shielding portion itself and the electronic circuit board; a dielectric portion between a conductive portion of the electronic component, and the shielding portion, the dielectric portion including a dielectric material having a relative permittivity of 6 or more; and a laminated portion around the electronic component, the laminated portion being a laminate of the shielding portion and the dielectric portion.

BRIEF DESCRIPTION OF THE DRAWINGS

FIG. 2A is a cross-sectional view of the electromagnetic shielding structure depicting a state before an electromagnetic shielding member is attached, and FIG. 2B is a cross-sectional view of the electromagnetic shielding structure depicting a state after the electromagnetic shielding member is attached;

FIG. 3A is a cross-sectional view of the electromagnetic shielding structure of when the multilayer board includes two ground layers according to a second example of the present disclosure, FIG. 3B is a cross-sectional view of the electromagnetic shielding structure of when a shielding portion includes a laminate of a metal layer and a resin film according to a third example of the present disclosure, and FIG. 3C is a cross-sectional view of the electromagnetic shielding structure in a case of having a structure where the shielding portion is in close contact with a dielectric portion according to a fourth example of the present disclosure.

DETAILED DESCRIPTION OF THE EMBODIMENTS

Figure 1A:
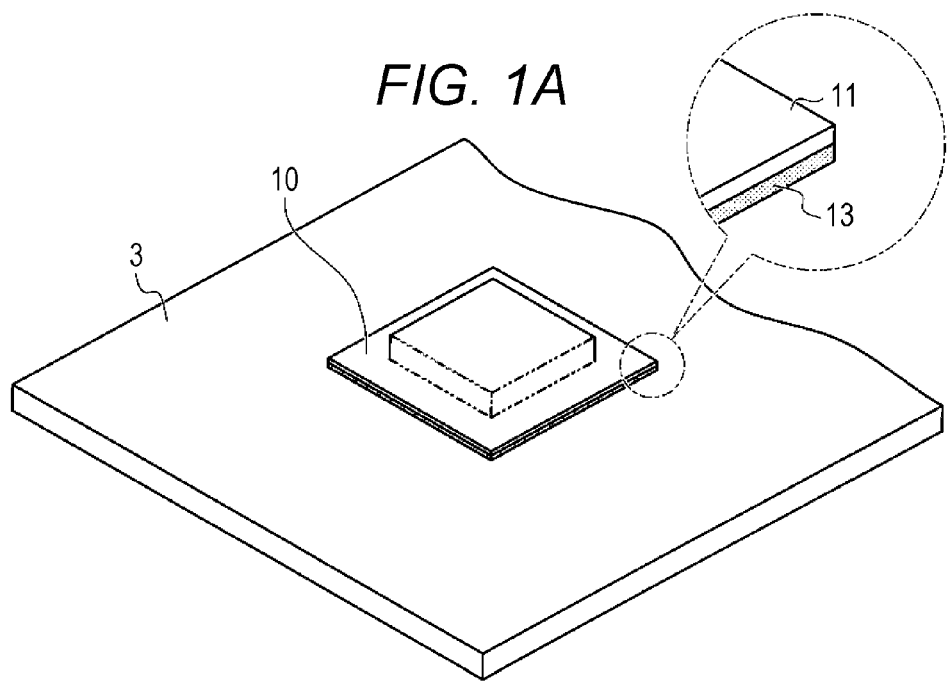
FIG. 1A is a perspective view of an electromagnetic shielding structure according to a first example of the present disclosure.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

An electromagnetic shielding member according to an embodiment of the present disclosure (the electromagnetic shielding member) comprises: a shielding portion, including a metal material, for sealing an electronic component on an electronic circuit board, between the shielding portion itself and the electronic circuit board; a dielectric portion between a conductive portion of the electronic component, and the shielding portion, the dielectric portion including a dielectric material having a relative permittivity of 6 or more; and a laminated portion around the electronic component, the laminated portion being a laminate of the shielding portion and the dielectric portion. The laminated portion may be configured in such a manner that capacitive coupling occurs between the shielding portion and aground layer of the electric circuit board via the dielectric portion In the electromagnetic shielding member, for example, metals such as aluminum and copper, and an alloy of these metals can be used as the metal material included in the shielding portion. These metal materials may be offered as a single metal such as a thin metal plate or metal foil. Alternatively, the shielding portion may include a laminate of a base material, such as a resin film (for example, a PET film), and a metal layer.

A material having a relative permittivity of 6 or more is used as the dielectric material forming the dielectric portion. However, from the viewpoint of encouraging capacitive coupling, the relative permittivity of the dielectric material is preferably higher and, more preferably, for example, 8 or more. Such a dielectric material may include, for example, a base material such as silicone or acrylic rubber, and fine-grain filler containing ceramic materials such as alumina, aluminum hydroxide, boron nitride, magnesium hydroxide, and tantalum pentaoxide, which are filled in the base material. The compounding ratio of the filler may be adjusted as appropriate considering the relative permittivity. One example is that, for example, if aluminum hydroxide is compounded with silicone, approximately 180 to 250 parts by weight of aluminum hydroxide may be compounded with 100 parts by weight of silicone.

According to the electromagnetic shielding member having the above configuration, the dielectric portion has a relative permittivity of 6 or more. The laminated portion of the shielding portion and the dielectric portion, and the electronic circuit board are laminated around the electronic component. Therefore, in this laminated area, capacitive coupling occurs between the shielding portion and a ground layer of the electronic circuit board. Hence, even under a situation where a high frequency voltage variation and the like occur in the shielding portion, it is possible to release noise to the ground layer, between which and the shielding portion capacitive coupling is occurring.

Therefore, even if it is difficult to connect the shielding portion to ground around the electronic component for reasons of, for example, the layout of the electronic component and/or wiring, it is possible to prevent or suppress the shielding portion, and a heat sink placed close to the shielding portion from becoming a radiation source of an electromagnetic wave. Moreover, even if the shielding portion can be connected to ground, the number of connections between the shielding portion and the ground can be reduced. Hence, a measure against electromagnetic waves can be taken more easily than an electromagnetic shielding member that requires connections at more points.

The electromagnetic shielding member may be further configured as the following modifications.

The electromagnetic shielding member may comprise a heat conduction portion including a dielectric material having a relative permittivity of 5 or less, the heat conduction portion being opposite the electronic circuit board side across the shielding portion and between a heat sink and the shielding portion.

In this configuration, the dielectric material forming the heat conduction portion has a relative permittivity of 5 or less. However, from the viewpoint of preventing capacitive coupling between the shielding portion and the heat sink, the lower the relative permittivity of the dielectric material the better and, for example, the relative permittivity is preferably 4 or less. In terms of such a dielectric material, for example, hollow filler, silicon oxide and their compound, and an organic material such as polyarylether/polyolefin are further compounded with a dielectric material similar to the above-mentioned dielectric portion. Accordingly, the relative permittivity can be reduced to 5 or below. Hence, even if the heat sink is placed close to the shielding portion across the heat conduction portion, it is possible to prevent or suppress capacitive coupling from occurring between the shielding portion and the heat sink. Hence, it is possible to appropriately release noise from the shielding portion to the ground layer side while noise is prevented or suppressed from being released from the shielding portion to the heat sink side. As a result, it is possible to prevent or suppress the heat sink from becoming a radiation source of an electromagnetic wave that becomes noise. The heat conduction portion is a portion that transfers heat from the shielding portion to the heat sink. Hence, the higher the thermal conductivity of the heat conduction portion the more preferable. However, the degree of the thermal conductivity to be secured may be adjusted as appropriate, considering the heating value of the electronic component, the heat dissipation of the heat sink, and the like by convection. An index of the thermal conductivity of the heat conduction portion is, for example, 1 W/m·K or more.

Moreover, the electromagnetic shielding member may comprise a thermal radiation portion including a thermal radiation material having a thermal emissivity of 0.8 or more, the thermal radiation portion being opposite the electronic circuit board side across the shielding portion to be in contact with the shielding portion.

From the viewpoint of encouraging thermal radiation, the higher the thermal emissivity the more preferable. For example, a material where filler such as silicon carbide, aluminum hydroxide, and magnesium hydroxide is filled in silicone resin, acrylic resin, fluororesin, and the like can be used as such a thermal radiation material.

According to the electromagnetic shielding member configured in this manner, the heat transferred from the electronic component to the shielding portion is further transferred to the thermal radiation portion. Consequently, the heat can be radiated from the thermal radiation portion as, for example, infrared. Therefore, if it is hard to dissipate heat sufficiently only with the shielding portion, for example, if the heating value of the electronic component is large, it is suitable to include such a thermal radiation portion.

Moreover, in the laminated portion of the electromagnetic shielding member, the dielectric portion may come into close contact with the shielding portion and the electronic circuit board with deformation.

According to the electromagnetic shielding member configured in this manner, the dielectric portion comes into close contact with the shielding portion and the electronic circuit board with deformation. Hence, as compared to a case where the dielectric portion does not deform, air gaps between the dielectric portion and the shielding portion, and between the dielectric portion and the electronic circuit board are hardly created. Therefore, as compared to a case where such air gaps are easily created, capacitive coupling can occur easily between the ground layer of the electronic circuit board, and the shielding portion.

Moreover, in the electromagnetic shielding member, the shielding portion and the dielectric portion include a housing portion where the electronic component is housed, and the laminated portion may be placed around the housing portion.

The above electromagnetic shielding member configured in this manner includes the above-mentioned housing portion and laminated portion. Hence, it is possible to house the electronic component in the housing portion and cause capacitive coupling in the laminated portion between the shielding portion and the ground layer, by simply attaching the electromagnetic shielding member onto the electronic circuit board.

Moreover, in the electromagnetic shielding member, the shielding portion has a concave portion corresponding to the housing portion, and the dielectric portion is placed to cover the concave portion and an opening periphery of the concave portion, and may be configured to deform and be recessed into the concave portion upon being pressed by the electronic component.

According to the electromagnetic shielding member configured in this manner, the shielding portion can be formed independently. Furthermore, for example, when the electromagnetic shielding member is attached onto the electronic circuit board, the dielectric portion is pressed by the electronic component and deformed into a shape corresponding to the housing portion. Therefore, there is no need to form in advance both of the shielding portion and the dielectric portion into shapes corresponding to the housing portion. Hence, the cost of processing can be reduced.

An electromagnetic shielding structure according to an embodiment of the present disclosure (the electromagnetic shielding structure) comprises: an electronic circuit board including a ground layer; an electronic component on the electronic circuit board; and the electromagnetic shielding member on the electronic circuit board.

The electromagnetic shielding structure comprises the above described electromagnetic shielding member. Hence, in the laminated area between the laminated portion of the shielding portion and the dielectric portion, and the electronic circuit board, capacitive coupling occurs between the shielding portion and the ground layer of the electronic circuit board. Therefore, noise can be released to the ground layer, between which and the shielding portion capacitive coupling is occurring. As a result, it is possible to prevent or suppress the shielding portion, and the heat sink placed close to the shielding portion from becoming a radiation source of an electromagnetic wave. Moreover, even if the shielding portion can be connected to ground, the number of connections between the shielding portion and the ground can be reduced. Hence, a measure against electromagnetic waves can be taken more easily than an electromagnetic shielding structure that requires connections at more points. Naturally, the electromagnetic shielding structure may include the above-mentioned modifications of the electromagnetic shielding member instead of the electromagnetic shielding member.

Next, the above-mentioned electromagnetic shielding member and electromagnetic shielding structure are described with more specific examples.

First Example

Figure 1B:
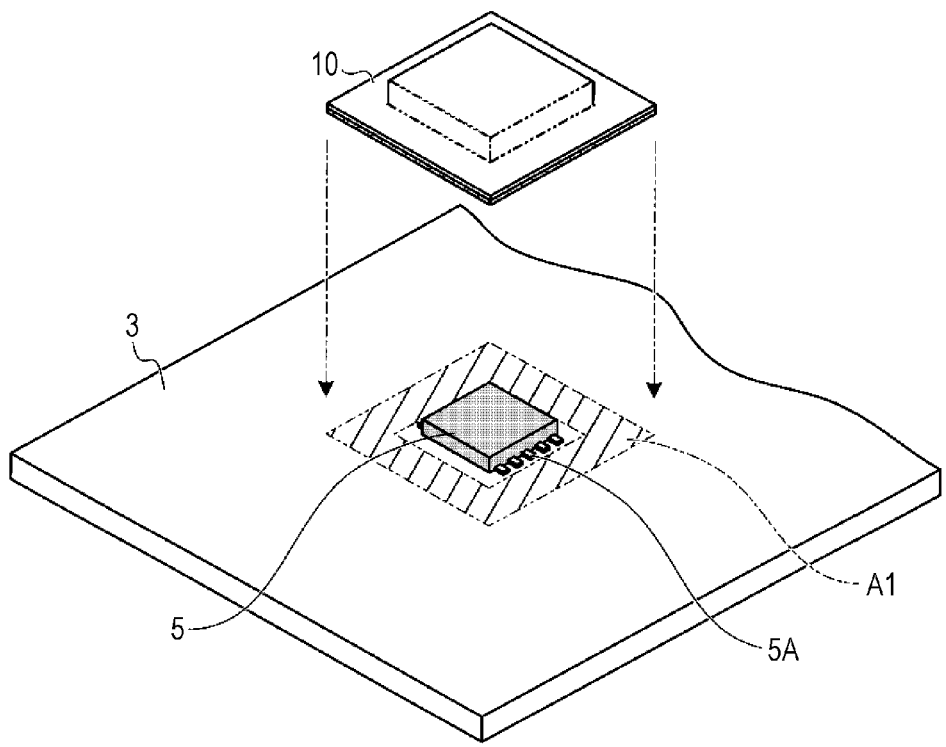
FIG. 1B is a perspective view of an exploded illustration of the electromagnetic shielding structure according to the first example.

An electromagnetic shielding structure depicted in FIGS. 1A and 1B comprises an electronic circuit board 3, an electronic component 5 mounted on the electronic circuit board 3, and an electromagnetic shielding member 10 attached onto the electronic circuit board 3. The electromagnetic shielding member 10 includes a shielding portion 11 and a dielectric portion 13.

The shielding portion 11 is formed by pressing a thin plate of a metal material (aluminum in the example) into a predetermined shape. The dielectric portion 13 is formed of a dielectric material having a relative permittivity of 6 or more. In a case of the example, a high dielectric composition having a relative permittivity of 9.3 and a thermal conductivity of 2 W/m·K is used as the dielectric material having a relative permittivity of 6 or more. In the high dielectric composition, 7 parts by weight of a crosslinking agent, and 360 parts by weight of fine-grain filler are compounded with 100 parts by weight of an acrylic resin base material. Specifically, the fine-grain filler contains 195 parts by weight of magnesium hydroxide or aluminum hydroxide, and 165 parts by weight of silicon carbide. In terms of magnesium hydroxide and aluminum hydroxide, one of magnesium hydroxide and aluminum hydroxide may be used, or they may be compounded at any ratio. All the values of the relative permittivities indicated in the specification are the values measured by Impedance/Material Analyzer (E4991A made by Agilent Technologies Inc.).

Figure 2A:
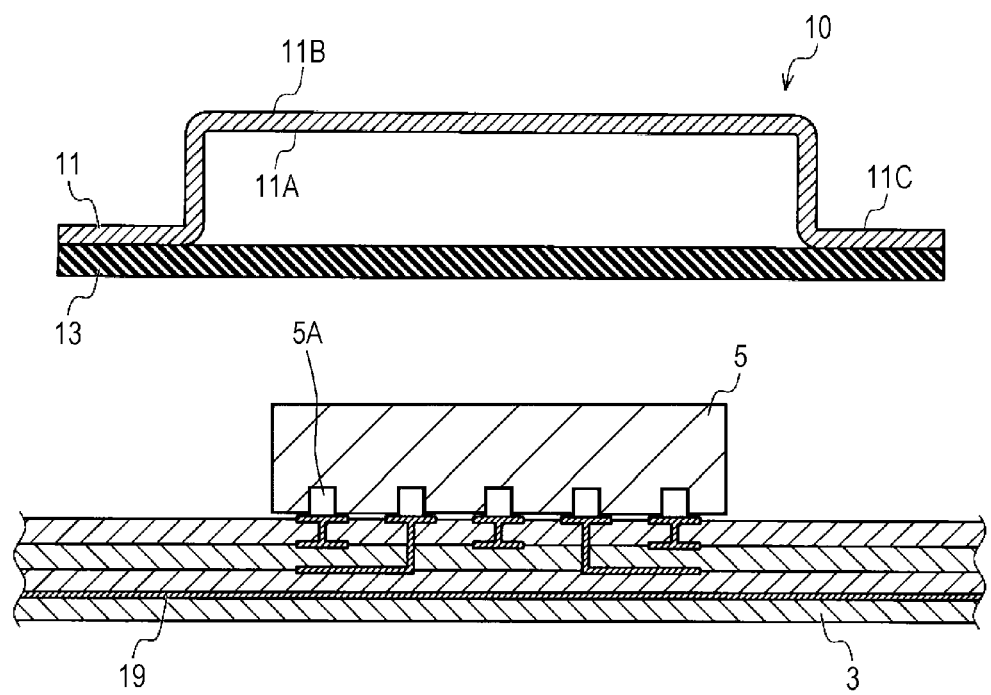
FIGS. 2A and 2B are cross-sectional views of the electromagnetic shielding structure of when a multilayer board includes one ground layer according to the first example.
Figure 2B:
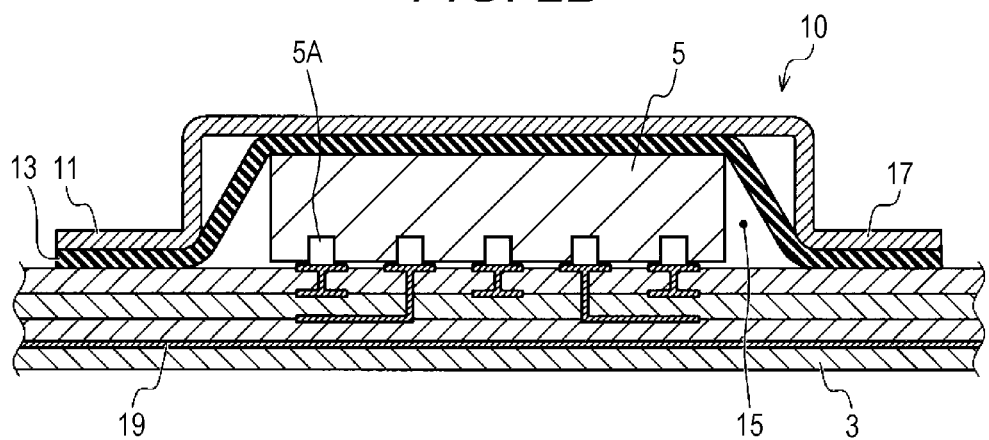

In the case of the example, as depicted in FIGS. 2A and 2B, the shielding portion 11 has been press-formed in advance into a shape having a concave portion 11A on the dielectric portion 13 side and a convex portion 11B on the back side of the concave portion 11A. On the other hand, the dielectric portion 13 has been formed into a sheet.

When the electromagnetic shielding member 10 is attached to the electronic circuit board 3, the dielectric portion 13 in the state depicted in FIG. 2A is pressed by the electronic component 5. Consequently, the dielectric portion 13 deforms in such a manner as to be recessed into the concave portion 11A. Consequently, as depicted in FIG. 2B, a part of the dielectric portion 13 is depressed to form a housing portion 15 where the electronic component 5 is housed. In other words, the shielding portion 11 and the dielectric portion 13 have (form) the housing portion 15 where the electronic component 5 is housed. The shielding portion 11 includes the concave portion 11A corresponding to the housing portion 15. The dielectric portion 13 is placed in such a manner as to cover the concave portion 11A and an opening periphery 11c of the concave portion 11A, and is configured to deform and be recessed into the concave portion 11A when pressed by the electronic component 5.

In the state depicted in FIG. 2B, the dielectric portion 13 is interposed between a conductive portion 5A of the electronic component 5, and the shielding portion 11. Consequently, the dielectric portion 13 electrically insulates the conductive portion 5A and the shielding portion 11. Moreover, the dielectric portion 13 comes into close contact with the shielding portion 11 and the electronic component with deformation. Consequently, the heat generated by the electronic component 5 is transferred to the shielding portion 11 via the dielectric portion 13.

Moreover, as depicted in FIG. 2B, a laminated portion 17 formed by laminating the opening periphery 11C of the shielding portion 11 and the dielectric portion 13 is formed (placed) around the housing portion 15. The laminated portion 17 is a portion that is further laminated on the electronic circuit board 3. In the laminated area, the shielding portion 11, the dielectric portion 13, and the electronic circuit board 3 are laminated in this order. In the laminated area, the dielectric portion 13 comes into close contact with the shielding portion 11 and the electronic circuit board 3 with deformation.

In the case of the electromagnetic shielding member 10, the surface of the dielectric portion 13 has adhesion (tackiness). Accordingly, the adhesion is used to bond the dielectric portion 13 and the shielding portion 11. Moreover, also when the electromagnetic shielding member 10 is attached to the electronic circuit board 3, the adhesion of the dielectric portion 13 is used to bond the electromagnetic shielding member 10 to the electronic circuit board 3. The bonding area of the electromagnetic shielding member 10 and the electronic circuit board 3 is an area A1 depicted in FIG. 1A. If the dielectric portion 13 is formed of a dielectric material with low adhesion, the shielding portion 11 and the dielectric portion 13, or the electromagnetic shielding member 10 and the electronic circuit board 3, may be bonded with an adhesive agent, or double-sided adhesive tape. However, if such an adhesive agent or double-sided adhesive tape is used, one that does not inhibit the functions of at least the shielding portion 11 and the dielectric portion 13 is selected.

The electronic circuit board 3 is a multilayer board including a ground layer 19 as depicted in FIGS. 2A and 2B. In the above-mentioned laminated area, capacitive coupling occurs between the shielding portion 11 and the ground layer 19. The contact area between the opening periphery 11C of the shielding portion 11, and the electronic circuit board 3, and the permittivity and thickness of the dielectric portion 13 are adjusted in such a manner that capacitive coupling occurs between the shielding portion 11 and the ground layer 19.

The electronic component 5 mounted on the electronic circuit board 3 is sealed in between the shielding portion 11 and the electronic circuit board 3 when covered by the electromagnetic shielding member 10. As a result, an electromagnetic wave radiated from the electronic component 5 and an electromagnetic wave reaching the electronic component 5 are blocked by the shielding portion 11.

According to the electromagnetic shielding structure configured as described above, capacitive coupling occurs between the shielding portion 11 and the ground layer 19 of the electronic circuit board 3 as described above. Hence, even under a situation where a high frequency voltage variation and the like occur in the shielding portion 11, it is possible to release noise to the ground layer 19, between which and the shielding portion 11 capacitive coupling is occurring.

Therefore, even if it is difficult to connect the shielding portion 11 to ground around the electronic component 5 for reasons of, for example, the layout of the electronic component 5 and/or wiring, it is possible to prevent or suppress the shielding portion 11, and a heat sink placed close to the shielding portion 11 from becoming a radiation source of an electromagnetic wave. Moreover, even if the shielding portion 11 can be connected to ground, the number of connections between the shielding portion 11 and the ground can be reduced. Hence, a measure against electromagnetic waves can be taken more easily than an electromagnetic shielding member that requires connections at more points.

Moreover, in the case of the above electromagnetic shielding member 10, the dielectric portion 13 comes into close contact with the shielding portion 11 and the electronic circuit board 3 with deformation. Hence, as compared to a case where the dielectric portion 13 does not deform, air gaps between the dielectric portion 13 and the shielding portion 11, and between the dielectric portion 13 and the electronic circuit board 3 are hardly created. Therefore, as compared to a case where such air gaps are easily created, capacitive coupling can occur easily between the ground layer 19 of the electronic circuit board 3, and the shielding portion 11.

Moreover, the above electromagnetic shielding member 10 comprises the above-mentioned housing portion 15 and laminated portion 17. Hence, it is possible to house the electronic component 5 in the housing portion 15 and cause capacitive coupling in the laminated portion 17 between the shielding portion 11 and the ground layer 19, by simply attaching the electromagnetic shielding member 10 onto the electronic circuit board 3.

Moreover, in the case of the above electromagnetic shielding member 10, the shielding portion 11 can be formed independently. Furthermore, when the electromagnetic shielding member 10 is attached onto the electronic circuit board 3, the dielectric portion 13 is pressed by the electronic component 5 and deformed into a shape corresponding to the housing portion 15. Therefore, there is no need to form in advance both of the shielding portion 11 and the dielectric portion 13 into shapes corresponding to the housing portion 15. Hence, the cost of processing can be reduced.

Second Example

Figure 3A:
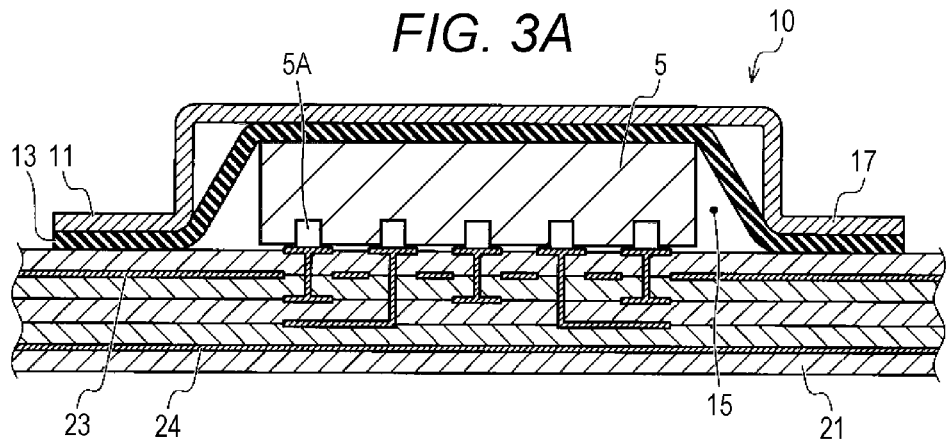
FIGS. 3A to 3C are cross-sectional views of the electromagnetic shielding structure.

An electronic circuit board 21 depicted in FIG. 3A may be adopted instead of the electronic circuit board 3 exemplified in the above-mentioned first example. As an EMC measure, the electronic circuit board 21 includes a first ground layer 23 and a second ground layer 24 that are respectively situated close to front and back sides of the board. In other words, the first ground layer 23 is provided on the front side of the electronic circuit board 3. On the other hand, the second ground layer 24 is provided on the back side of the electronic circuit board 3. In this case, the shielding portion 11 of the electromagnetic shielding member 10 and the first ground layer 23 of the electronic circuit board 21 are located closer to each other than in the electronic circuit board 3 exemplified in the first example. Hence, stronger capacitive coupling occurs between the shielding portion 11 and the first ground layer 23. Therefore, the shielding performance of the shielding portion 11 is further improved.

Third Example

Figure 3B:
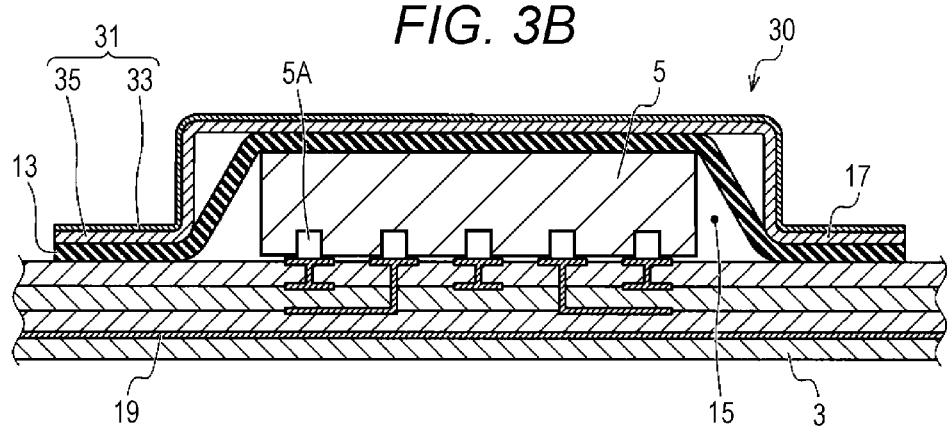

The electromagnetic shielding member according to an embodiment of the present disclosure may be an electromagnetic shielding member 30 depicted in FIG. 3B. A shielding portion 31 of the electromagnetic shielding member 30 is a laminate of a film material 33 made of resin (in the example, a PET (polyethylene terephthalate) film) and a metal layer 35 (in the example, an aluminum deposition layer).

Fourth Example

Figure 3C:
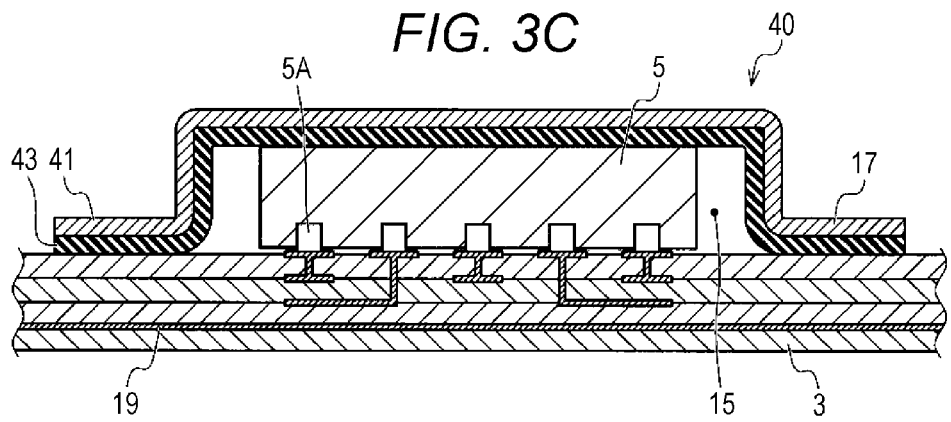

The electromagnetic shielding member according to an embodiment of the present disclosure may be an electromagnetic shielding member 40 depicted in FIG. 3C. The electromagnetic shielding member 40 has a structure where a shielding portion 41 and a dielectric portion 43 are in close contact with each other with substantially no space therebetween. In other words, in this example, the dielectric portion 43 covers a surface of the shielding portion 41 on the electronic component 5 side. In this case, there is substantially no air gap between the shielding portion 41 and the dielectric portion 43. Hence, as compared to the above-mentioned first example, the heat generated by the electronic component 5 is transferred even more efficiently to the shielding portion 41 via the dielectric portion 43.

However, in this example, unlike the first example, the shape of the dielectric portion 43 is processed in advance into a shape that comes into close contact with the shielding portion 41 with substantially no space. Therefore, in terms of which structure of the first and fourth examples should be adopted, a desired structure may be adopted considering the performance of thermal conduction efficiency and the workload of processing.

Fifth Example

Figure 4A:
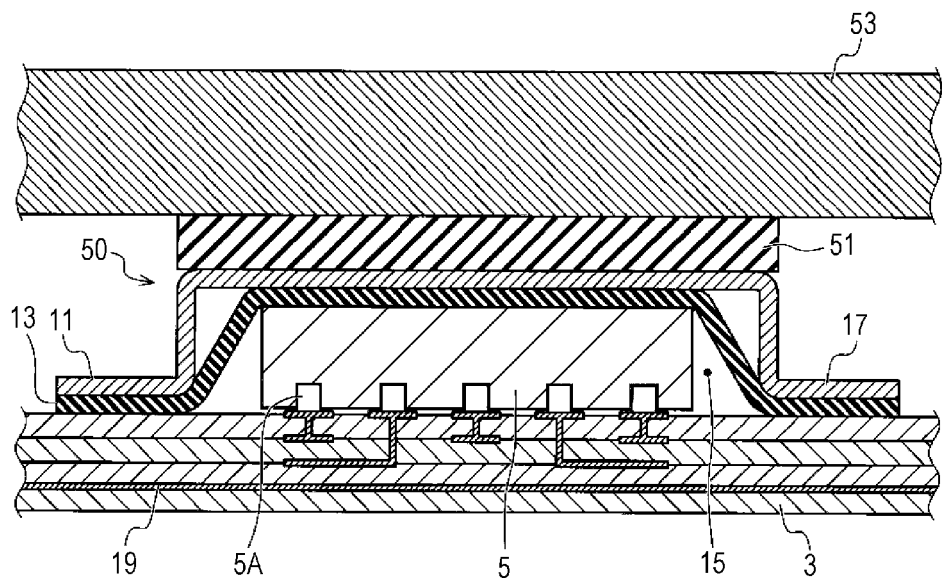
FIG. 4A is a cross-sectional view of the electromagnetic shielding structure including a heat conduction portion and a heat sink according to a fifth example of the present disclosure.

An electromagnetic shielding member 50 depicted in FIG. 4A includes a heat conduction portion 51 in addition to a configuration equivalent to the electromagnetic shielding member 10 depicted in the first example. The heat conduction portion 51 is formed of a dielectric material having a relative permittivity of 5 or less. In a case of the example, a low dielectric composition having a relative permittivity of 3.8 and a thermal conductivity of 1 W/m·K is used as the dielectric material having a relative permittivity of 5 or less. In the low dielectric composition, 265 parts by weight of fine-grain filler is compounded with 100 parts by weight of a silicone base material. Specifically, the fine-grain filler contains 220 parts by weight of magnesium hydroxide or aluminum hydroxide, and 45 parts by weight of inorganic fly ash balloon. In terms of magnesium hydroxide and aluminum hydroxide, one of magnesium hydroxide and aluminum hydroxide may be used, or they may be compounded at any ratio.

The heat conduction portion 51 is placed opposite the electronic circuit board 3 side across the shielding portion 11. The heat conduction portion 51 is in contact with the shielding portion 11 and a heat sink 53. The heat conduction portion 51 is interposed between the heat sink 53 and the shielding portion 11. Heat is transferred from the shielding portion 11 to the heat sink 53.

According to the electromagnetic shielding member 50 configured in this manner, the heat transferred from the electronic component 5 to the shielding portion 11 can be released to the heat sink 53 via the heat conduction portion 51. Therefore, if it is hard to dissipate heat sufficiently only with the shielding portion 11, for example, if the heating value of the electronic component 5 is large, it is suitable to include such a heat conduction portion 51.

Moreover, the heat conduction portion 51 is formed of a dielectric material having a relative permittivity of 5 or less. Hence, even if the heat sink 53 is placed close to the shielding portion 11 across the heat conduction portion 51, it is possible to prevent or suppress capacitive coupling from occurring between the shielding portion 11 and the heat sink 53. Hence, it is possible to appropriately release noise from the shielding portion 11 to the ground layer 19 side while noise is prevented or suppressed from being released from the shielding portion 11 to the heat sink 53 side. As a result, it is possible to prevent or suppress the heat sink 53 from becoming a radiation source of an electromagnetic wave that becomes noise.

Sixth Example

Figure 4B:
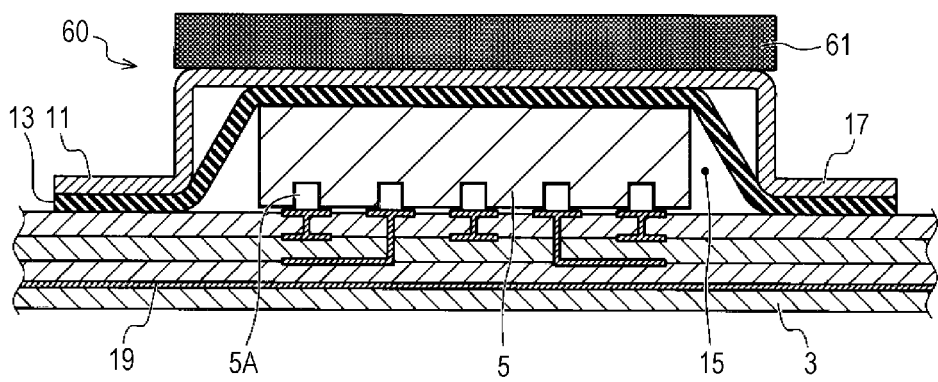
FIG. 4B is a cross-sectional view of the electromagnetic shielding structure including a thermal radiation portion according to a sixth example of the present disclosure.

An electromagnetic shielding member 60 depicted in FIG. 4B includes a thermal radiation portion 61 in addition to a configuration equivalent to the electromagnetic shielding member 10 depicted in the first example. The thermal radiation portion 61 is formed of a thermal radiation material having a thermal emissivity of 0.8 or more. In the case of the example, a thermal radiation composition having a thermal emissivity of 0.92 is used as the thermal radiation material having a thermal emissivity of 0.8 or more. In the thermal radiation composition, 15 parts by weight of a crosslinking agent and 265 parts by weight of fine-grain filler are compounded with 100 parts by weight of an acrylic resin base material. Specifically, the fine-grain filler contains 265 parts by weight of magnesium hydroxide or aluminum hydroxide. In terms of magnesium hydroxide and aluminum hydroxide, one of magnesium hydroxide and aluminum hydroxide may be used, or they may be compounded at any ratio. The thermal radiation portion 61 is placed opposite the electronic circuit board 3 side across the shielding portion 11 in such a manner as to be in contact with the shielding portion 11. The thermal radiation portion 61 radiates the heat transferred from the shielding portion 11 as, for example, infrared.

According to the electromagnetic shielding member 60 configured in this manner, the heat transferred from the electronic component 5 to the shielding portion 11 is further transferred to the thermal radiation portion 61. Consequently, the heat can be radiated from the thermal radiation portion 61 as, for example, infrared. Therefore, if it is hard to dissipate heat sufficiently only with the shielding portion 11, for example, if the heating value of the electronic component 5 is large, it is suitable to include such a thermal radiation portion 61.

Other Examples

Up to this point the electromagnetic shielding member and the electromagnetic shielding structure have been described with some specific examples. However, embodiments of the present disclosure are not limited to the above examples. The present disclosure can be embodied in various forms within a scope that does not depart from the technical idea of the present disclosure.

For example, in the above examples, aluminum is exemplified as the metal material forming the shielding portion 11. However, the metal material is not limited to aluminum. For example, copper and an alloy including a metal such as aluminum or copper, and a film material containing layers of these various metals can be optionally used as the metal material forming the shielding portion 11.

Moreover, in the above-mentioned examples, in terms of the dielectric material forming the dielectric portion, substances used as the base material and the fine-grain filler are exemplified. As long as the permittivity defined in the specification can be achieved, whether or not the exemplified substances are compounded with the dielectric material can be chosen freely. Another substance may be compounded with the dielectric material. For example, ceramic materials such as alumina, boron nitride, and tantalum oxide may be used as the substances included in the fine-grain filler, instead of aluminum hydroxide and magnesium hydroxide.

The heat sink 53 depicted in FIG. 4A can be said to be placed opposite the electronic circuit board 3 side across the shielding portion 11. The shielding portion 11 may be the resin film material 33 including the metal layer 35.

Embodiments of the present disclosure may be the following first to sixth electromagnetic shielding members and first electromagnetic shielding structure.

The first electromagnetic shielding member comprises: a shielding portion, having a metal material, for sealing an electronic component mounted on an electronic circuit board in between with the electromagnetic circuit board to block an electromagnetic wave radiated from the electronic component and an electromagnetic wave reaching the electronic component; and a dielectric portion including a dielectric material having a relative permittivity of 6 or more, the dielectric portion being interposed between a conductive portion of the electronic component and the shielding portion to electrically insulate the conductive portion from the shielding portion, and has a structure where the shielding portion, the dielectric portion, and the electronic circuit board are laminated in this order around the electronic component, wherein capacitive coupling occurs in the laminated area between the shielding portion and a ground layer of the electronic circuit board.

The second electromagnetic shielding member according to the first electromagnetic shielding member comprises a heat conduction portion including a dielectric material having a relative permittivity of 5 or less, the heat conduction portion being interposed between a heat sink placed opposite the electronic circuit board side across the shielding portion, and the shielding portion to transfer heat from the shielding portion to the heat sink.

The third electromagnetic shielding member according to the first electromagnetic shielding member comprises a thermal radiation portion having a thermal radiation material of a thermal emissivity of 0.8 or more, the thermal radiation portion being placed opposite the electronic circuit board side across the shielding portion to radiate the heat transferred from the shielding portion as infrared.

In the fourth electromagnetic shielding member according to any of the first to third electromagnetic shielding members, in the laminated area, the dielectric portion comes into contact with the shielding portion and the electronic circuit board with deformation.

The fifth electromagnetic shielding member according to any of the first to fourth electromagnetic shielding members comprises a housing portion where the electronic component is housed, and a laminated portion forming the laminated area around the housing portion.

In the sixth electromagnetic shielding member according to the fifth electromagnetic shielding member, the shielding portion is formed in advance into a shape forming a concave portion on the dielectric portion side and forming a convex portion on the back side of the concave portion, the dielectric portion is placed in a position that covers the concave portion and an opening periphery of the concave portion, and, when the electromagnetic shielding member is attached onto the electronic circuit board, if the dielectric portion is pressed by the electronic component, the dielectric portion deforms and is recessed into the concave portion to form the housing portion.

The first electromagnetic shielding structure comprises: an electronic circuit board having a ground layer; an electronic component mounted on the electronic circuit board; and an electromagnetic shielding member attached onto the electronic circuit substrate, wherein the electromagnetic shielding member has a shielding portion, including a metal material, for sealing the electronic component mounted on the electronic circuit board in between the electronic circuit board to block an electromagnetic wave radiated from the electronic component and an electromagnetic wave reaching the electronic component, and a dielectric portion including a dielectric material having a relative permittivity of 6 or more, the dielectric portion being interposed between a conductive portion of the electronic component, and the shielding portion to electrically insulate the conductive portion from the shielding portion, and has a structure where the shielding portion, the dielectric portion, and the electronic circuit board are laminated in this order around the electronic component, and capacitive coupling occurs in the laminated area between the shielding portion and a ground layer of the electronic circuit board.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. An electromagnetic shielding member comprising:
    a shielding portion, including a metal material, for sealing an electronic component on an electronic circuit board, between the shielding portion itself and the electronic circuit board;
    a dielectric portion between a conductive portion of the electronic component, and the shielding portion, the dielectric portion including a dielectric material having a relative permittivity of 6 or more; and
    a laminated portion around the electronic component, the laminated portion being a laminate of the shielding portion and the dielectric portion;
    wherein the laminated portion is configured in such a manner that capacitive coupling occurs between the shielding portion and a ground layer of the electronic circuit board via the dielectric portion.

2. The electromagnetic shielding member according to claim 1, further comprising a heat conduction portion including a dielectric material having a relative permittivity of 5 or less, the heat conduction portion being opposite the electronic circuit board side across the shielding portion and between a heat sink and the shielding portion.

3. The electromagnetic shielding member according to claim 2, wherein the heat conduction portion includes a dielectric material having a relative permittivity of 4 or less.

4. The electromagnetic shielding member according to claim 2, wherein a thermal conductivity of the heat conduction portion is 1 W/m·K or more.

5. The electromagnetic shielding member according to claim 1, further comprising a thermal radiation portion including a thermal radiation material having a thermal emissivity of 0.8 or more, the thermal radiation portion being opposite the electronic circuit board side across the shielding portion to be in contact with the shielding portion.

6. The electromagnetic shielding member according to claim 1, wherein in the laminated portion, the dielectric portion comes into close contact with the shielding portion and the electronic circuit board with deformation.

7. The electromagnetic shielding member according to claim 1, wherein
    the shielding portion and the dielectric portion include a housing portion where the electronic component is housed, and
    the laminated portion is placed around the housing portion.

8. The electromagnetic shielding member according to claim 7, wherein
    the shielding portion has a concave portion corresponding to the housing portion, and
    the dielectric portion is placed to cover the concave portion and an opening periphery of the concave portion, and is configured to deform and be recessed into the concave portion upon being pressed by the electronic component.

9. The electromagnetic shielding member according to claim 1, wherein the shielding portion includes a laminate of a metal layer and a resin film material.

10. The electromagnetic shielding member according to claim 1, wherein the dielectric portion covers a surface of the shielding portion on the electronic component side.

11. The electromagnetic shielding member according to claim 1, wherein the dielectric portion includes a dielectric material having a relative permittivity of 8 or more.

12. An electromagnetic shielding structure comprising:
    an electronic circuit board including a ground layer;
    an electronic component on the electronic circuit board; and
    the electromagnetic shielding member according to claim 1 on the electronic circuit board.

13. The electromagnetic shielding structure according to claim 12, wherein the ground layer includes
    a first ground layer on a front side of the electronic circuit board, and a second ground layer on a back side of the electronic circuit board.

\* \* \* \* \*